US009406772B1

(12) United States Patent
Wang et al.

(10) Patent No.: US 9,406,772 B1
(45) Date of Patent: Aug. 2, 2016

(54) SEMICONDUCTOR STRUCTURE WITH A MULTILAYER GATE OXIDE AND METHOD OF FABRICATING THE SAME

(71) Applicant: UNITED MICROELECTRONICS CORP., Hsin-Chu (TW)

(72) Inventors: Shao-Wei Wang, Taichung (TW); Shu-Ming Yeh, Tainan (TW); Yu-Tung Hsiao, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/609,446

(22) Filed: Jan. 30, 2015

(51) Int. Cl.
*H01L 29/76* (2006.01)
*H01L 29/51* (2006.01)
*H01L 29/423* (2006.01)
*H01L 21/02* (2006.01)
*H01L 21/3105* (2006.01)
*H01L 29/66* (2006.01)

(52) U.S. Cl.
CPC .......... *H01L 29/513* (2013.01); *H01L 21/0206* (2013.01); *H01L 21/02164* (2013.01); *H01L 21/02238* (2013.01); *H01L 21/02255* (2013.01); *H01L 21/31051* (2013.01); *H01L 29/42364* (2013.01); *H01L 29/517* (2013.01); *H01L 29/66545* (2013.01)

(58) Field of Classification Search
CPC ................ H01L 29/513; H01L 29/517; H01L 29/42364; H01L 29/66545; H01L 21/0206; H01L 21/02164; H01L 21/0223; H01L 21/02255
USPC .................................. 257/411; 438/216, 287
See application file for complete search history.

(56) References Cited

U.S. PATENT DOCUMENTS

| 6,737,362 | B1 | 5/2004 | Chen | |
| 2005/0230752 | A1* | 10/2005 | Kanno | H01L 29/42384 257/347 |
| 2011/0143469 | A1* | 6/2011 | Nakamura | H01L 21/288 438/30 |

* cited by examiner

Primary Examiner — Tu-Tu Ho
(74) Attorney, Agent, or Firm — Winston Hsu; Scott Margo

(57) ABSTRACT

A semiconductor structure with a multilayer gate oxide is provided. The structure includes a substrate. A multilayer gate oxide is disposed on the substrate, wherein the multilayer gate oxide includes a first gate oxide and a second gate oxide. The first gate oxide contacts the substrate and the second gate oxide is disposed on and contacts the first gate oxide. The second gate oxide is hydrophilic. The first gate oxide is formed by a thermal oxidation process. The second gate oxide is formed by a chemical treatment.

7 Claims, 5 Drawing Sheets

SEMICONDUCTOR STRUCTURE WITH A MULTILAYER GATE OXIDE AND METHOD OF FABRICATING THE SAME

BACKGROUND OF THE INVENTION

1. Field of the Invention

The present invention relates to a multilayer gate oxide, and more particularly to a semiconductor structure with a multilayer gate oxide and method of fabricating the same.

2. Description of the Prior Art

Field effect transistors (FETs) are commonly used in conventional integrated circuit (IC) design. Due to shrinking technology nodes, devices and shrinking ground rules are the keys to enhance performance and to reduce cost.

In standard MOS devices, silicon oxide is the standard gate dielectric. As the devices are scaled down, the gate dielectric needs to become thinner. The gate dielectric is formed by a thermal oxidation process, since this kind of silicon oxide has better quality. For next generation devices, the thickness of the silicon oxide has to be much smaller than before. Silicon oxide made by thermal oxidation will have pin holes when its thickness is shrunk down to a certain level, however, and the quality of will be deteriorated.

Therefore, a method of making silicon oxide having fewer pin holes is needed.

SUMMARY OF THE INVENTION

One embodiment of the present invention sets forth a semiconductor structure with a multilayer gate oxide. Such a structure includes a substrate. A multilayer gate oxide is disposed on the substrate, wherein the multilayer gate oxide includes a first gate oxide and a second gate oxide. The first gate oxide contacts the substrate and the second gate oxide is disposed on and contacts the first gate oxide. The second gate oxide is hydrophilic.

Another embodiment of the present invention sets forth a method of fabricating a semiconductor structure with a multilayer gate oxide. The method includes providing a substrate. A thermal oxidation process is performed to form a silicon oxide layer on the substrate. Later, a thickness of the silicon oxide layer is reduced to form a first gate oxide. Subsequently, a chemical treatment is performed to the first gate oxide so as to form a second gate oxide on the first gate oxide. A high-K material is then formed to contact the second gate oxide. Finally, a metal gate is formed on the high-K material.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
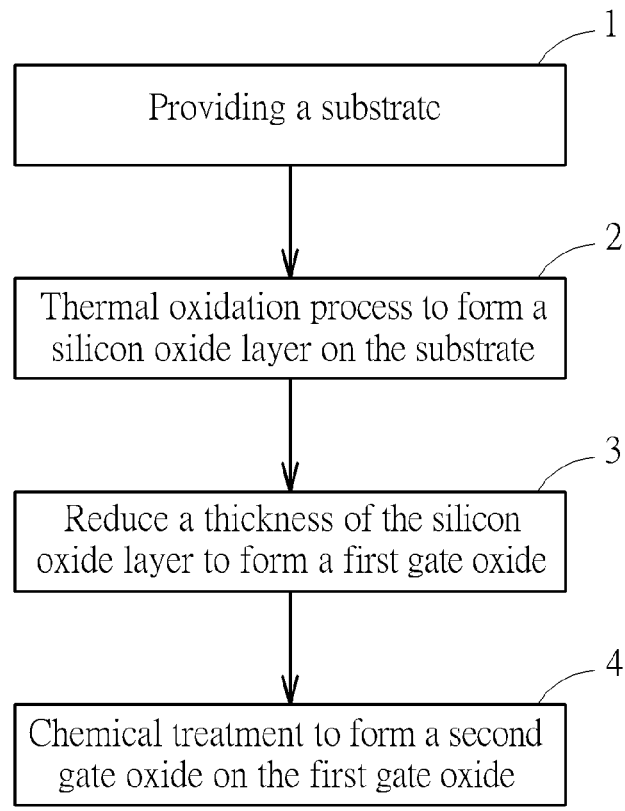
FIG. 1 illustrates flow charts of an exemplary method of the present invention for forming a multilayer gate oxide.
Figure 2:
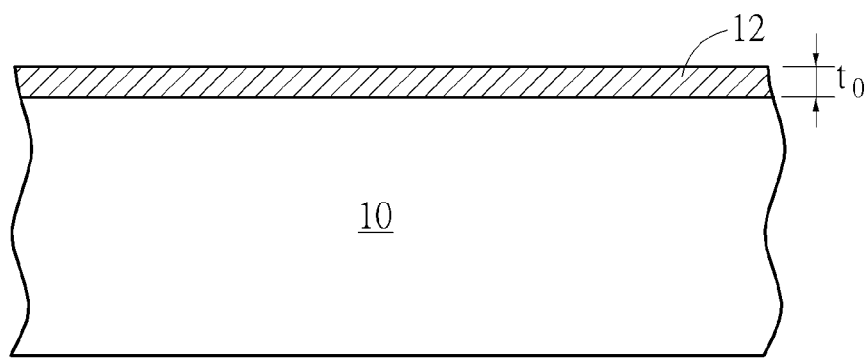
FIG. 2 to FIG. 4 schematically describe a method of fabricating a multilayer gate oxide according to a first preferred embodiment of the present invention.
Figure 3:
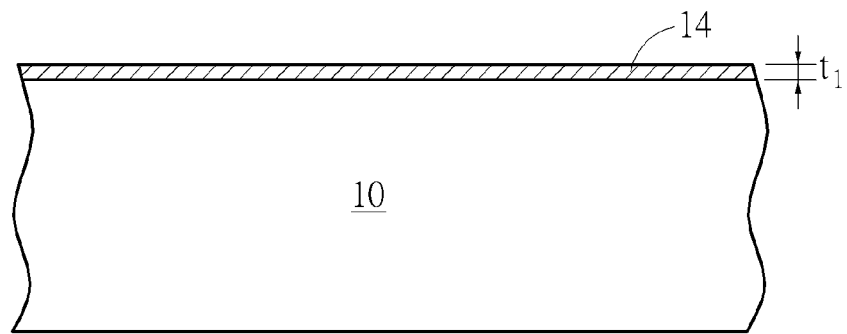
Figure 4:
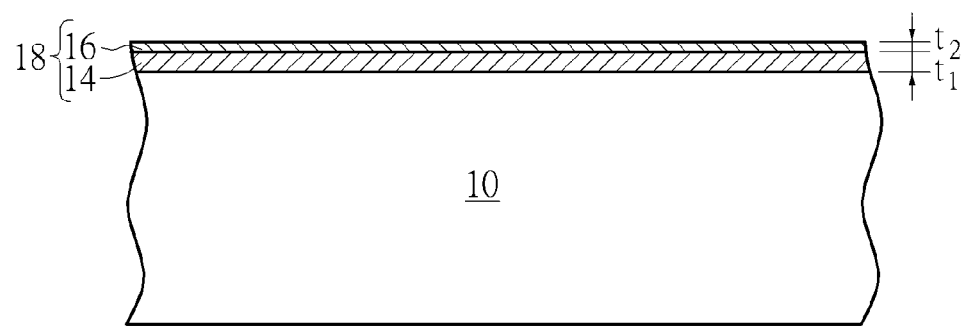

FIG. 1 illustrates flow charts of an exemplary method of the present invention for forming a multilayer gate oxide. FIG. 2 to FIG. 4 schematically describe a method of fabricating a multilayer gate oxide according to a first preferred embodiment of the present invention. As shown in FIG. 1 and FIG. 2, in step 1, a substrate 10 is provided. The substrate 10 may be a bulk silicon substrate, a germanium substrate, a gallium arsenide substrate, a silicon germanium substrate, an indium phosphide substrate, a gallium nitride substrate, a silicon carbide substrate, or a silicon on insulator (SOI) substrate. In step 2, a thermal oxidation process is performed to form a silicon oxide layer 12 on the substrate 10. The thermal oxidation process may be performed by oxidizing the substrate 10 at a temperature not less than 1050 degrees Celsius. According to a preferred embodiment of the present invention, a thickness $t_0$ of the silicon oxide layer 12 is above 10 angstroms. Advantageously, the silicon oxide layer 12 may have a thickness $t_0$ of 10 to 20 angstroms. As shown in FIG. 3 and step 3 in FIG. 1, the thickness $t_0$ of the silicon oxide layer 12 is reduced preferably by an etching back process to form a first gate oxide 14. The remaining silicon oxide layer 12 becomes the first gate oxide 14, and a first thickness $t_1$ of the first gate oxide 14 is greater than 0. Preferably, a first thickness $t_1$ of the first gate oxide 14 may be 6 to 8 angstroms.

Please refer to FIG. 4 and step 4 in FIG. 1. A chemical treatment is performed on the first gate oxide 14 so as to form a second gate oxide 16 on the first gate oxide 14. More specifically, the chemical treatment preferably includes using a mixture comprising ammonia hydroxide and hydrogen peroxide to wash the first gate oxide 14. After the chemical treatment, the second gate oxide 16 will grow on the first gate oxide 14 through the chemical reaction. It is noteworthy that the second gate oxide 16 is hydrophilic. At this point, a multilayer gate oxide 18 including the first gate oxide 14 and the second gate oxide 16 is completed.

Please refer to FIG. 4. A multilayer gate oxide is provided in the present invention. The multilayer gate oxide 18 of the present invention is disposed on a substrate 10. The multilayer gate oxide 18 includes a first gate oxide 14 contacting the substrate 10 and a second gate oxide 16 disposed on and contacting the first gate oxide 14. The second gate oxide 16 is hydrophilic. A first thickness $t_1$ of the first gate oxide 14 is greater than a second thickness $t_2$ of the second gate oxide 16. The first gate oxide 14 may have the first thickness $t_1$ of 6 to 8 angstroms. The second thickness $t_2$ of the second gate oxide 16 is preferably 2 to 6 angstroms. The present invention is not limited to the abovementioned first and second thicknesses $t_1/t_2$ of the first gate oxide 14 and the second gate oxide 16, however. According to a preferred embodiment of the present invention, the ratio of the first thickness $t_1$ to the second thickness $t_2$ is not smaller than 3/2. Preferably, the ratio of the first thickness $t_1$ to the second thickness $t_2$ is 3/2 or 7/3. Furthermore, the first gate oxide 14 has a chemical formula of $Si_AO_B$. The second gate oxide 16 has chemical formula of $Si_XO_Y$. The ratio of B to A is greater than the ratio of Y to X. For example, the ratio of B to A is 1.94/1, and the ratio of Y to X is 0.96/1. That is, the first gate oxide 14 and the second gate oxide 16 have different physical properties. Moreover, because the silicon oxide layer 12 is grown to a determined thickness, such as 10 to 20 angstroms, the pin hole problem can be eliminated by making the silicon oxide layer 12 to have sufficient thickness. Since the silicon oxide layer 12 does not have the pin hole problem, the first gate oxide 14 formed by etching back silicon oxide layer 12 also does not have the pin hole problem, so the quality of the first gate oxide 14 is enhanced. Because the second gate oxide 16 is formed by the chemical treatment, the second gate oxide 16 has hydroxides bonded thereon, and the hydrophilic property of the second gate oxide 16 is thus increased. The second gate oxide 16 is more hydrophilic than the first gate oxide 14. In other words, the second gate oxide 16 has a smaller water contact angle than the first gate oxide 14 has.

The method illustrated in FIG. 1 to FIG. 4 can be applied to fabricating semiconductor structures such as high-K metal gate transistors. The method of forming a multilayer gate oxide of the present invention can also be utilized in other fields, and is not limited to the high-K metal gate transistors. For example, the method of forming a multilayer gate oxide of the present invention can be applied to make polysilicon gate transistors.

FIG. 2 to FIG. 7 schematically show a method of fabricating a high-K metal gate transistor with a multilayer gate oxide by a high-K dielectric first process according to a second preferred embodiment of the present invention, wherein like reference numerals are used to refer to like elements throughout. A multilayer gate oxide 18 is formed according to the method illustrated in FIG. 2 to FIG. 4. As shown in FIG. 2 to FIG. 4, a first gate oxide 14 is formed on a substrate 10 by a thermal oxidation process and followed by an etching back process. A second gate oxide 16 is formed on the first gate oxide 14 by a chemical treatment. For details of the fabricating methods and properties of the first gate oxide 14 and the second gate oxide 16, please refer to the first preferred embodiment of the present invention.

Figure 5:
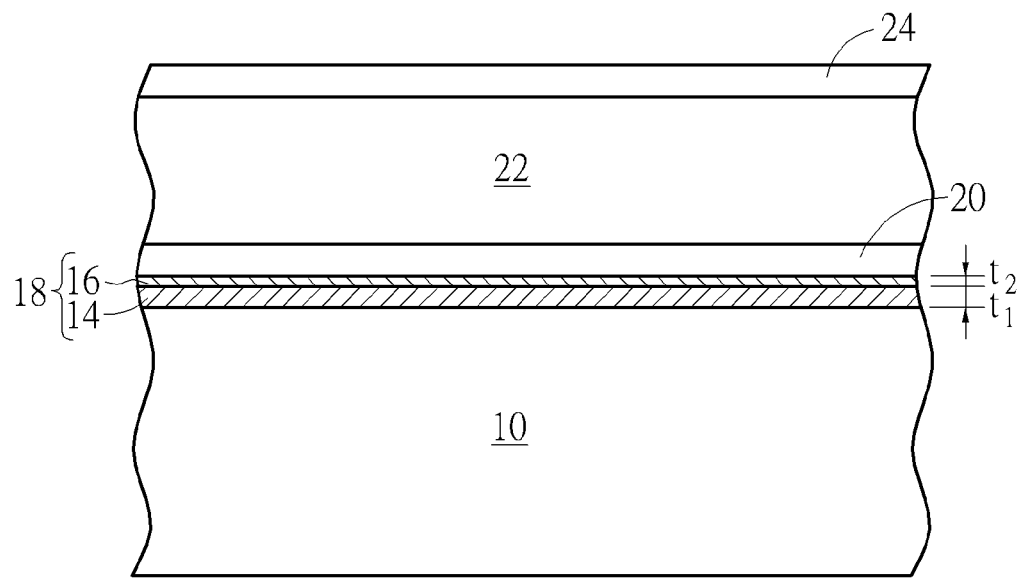
FIG. 5 to FIG. 7 schematically show a method of fabricating a high-K metal gate transistor with a multilayer gate oxide by a high-K dielectric first process according to a second preferred embodiment of the present invention.
Figure 6:
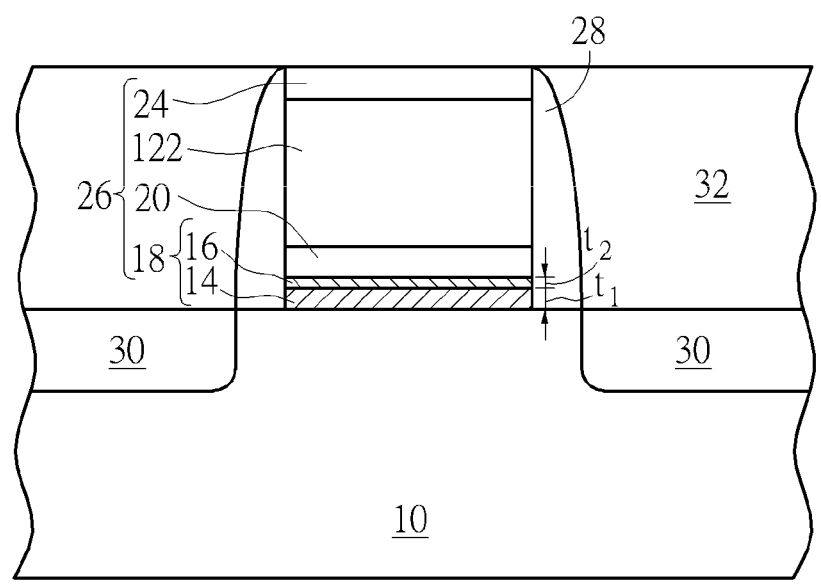

As shown in FIG. 5, a high-K dielectric 20 is formed on the second gate oxide 16. Because the second gate oxide 16 is formed by chemical treatment, the second gate oxide 16 is hydrophilic. Therefore, the high-K dielectric 20 can attach well to the second gate oxide 16. After that, a barrier layer (not shown) can be optionally formed on the high-K dielectric 20. The barrier layer is for protecting the high-K dielectric 20 from being damaged when a dummy gate is removed in a subsequent process. Then, a polysilicon layer 22 and a cap layer 24 are formed on the high-K dielectric 20 in sequence. As shown in FIG. 6, the first gate oxide 14, the second gate oxide 16, the high-K dielectric 20, the polysilicon layer 22, and the cap layer 24 are patterned to form a gate structure 26. The patterned polysilicon layer 22 becomes a dummy gate 122. Therefore, the first gate oxide 14, the second gate oxide 16, the high-K dielectric 20, the dummy gate 122, and the cap layer 24 constitute the gate structure 26. The first gate oxide 14, the second gate oxide 16 and the high-K dielectric 20 are all in a rectangular profile. A spacer 28 is formed to surround the gate structure 26. After that, a source/drain doped region 30 is formed in the substrate 10 at two sides of the gate structure 26. Later, a dielectric layer 32 is formed to cover the gate structure 26, the spacer 28 and the substrate 10.

Figure 7:
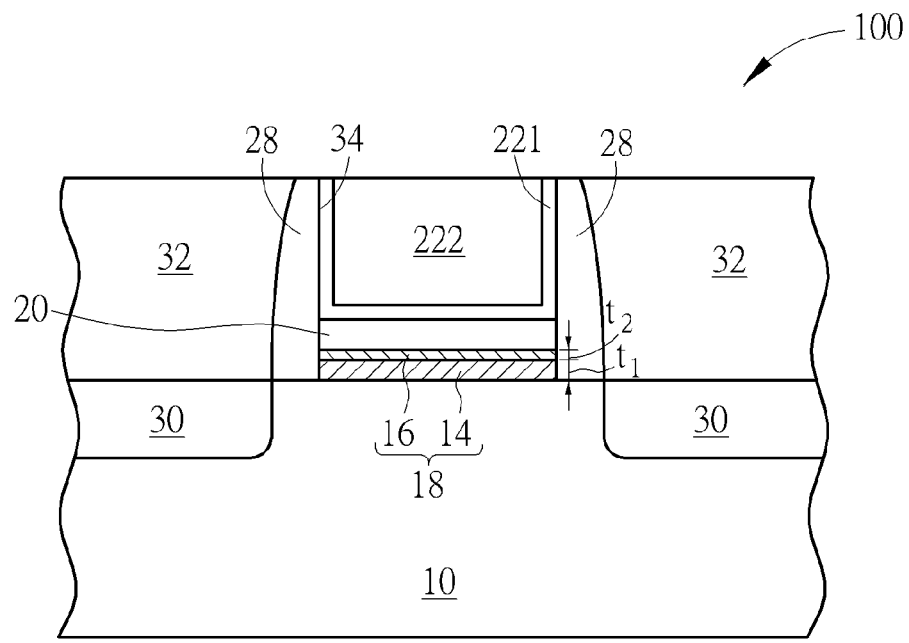

As shown in FIG. 7, the dielectric layer 32 is planarized and the cap layer 24 is removed to expose the dummy gate 122. Later, the dummy gate 122 is removed to form a recess 34. Then, a work function layer 221 fills in the recess 34. Later, a metal filling layer 222 is formed to fill in the recess 34. At this point, a high-K metal gate transistor 100 with a multilayer gate oxide 18 fabricated by a high-K dielectric first process is completed. As shown in FIG. 7, the semiconductor structure with a multilayer gate oxide, such as the high-K metal gate transistor 100 is provided. The high-K metal gate transistor 100 has a multilayer gate oxide 18 disposed on a substrate 10. For details of the fabricating methods and properties of the first gate oxide 14 and the second gate oxide 16 please refer to the first preferred embodiment of the present invention. A high-K dielectric 20 contacts the second gate oxide 16 of the multilayer gate oxide 18. The high-K dielectric 20 can be thicker or thinner than the multilayer gate oxide 18. The high-K dielectric 20 includes $ZrO_2$, $HfO_2$ $Al_2O_3$, BST, PZT, $ZrSiO_2$, $HfSiO_2$, $TaO_2$ or other suitable high-K materials.

Figure 8:
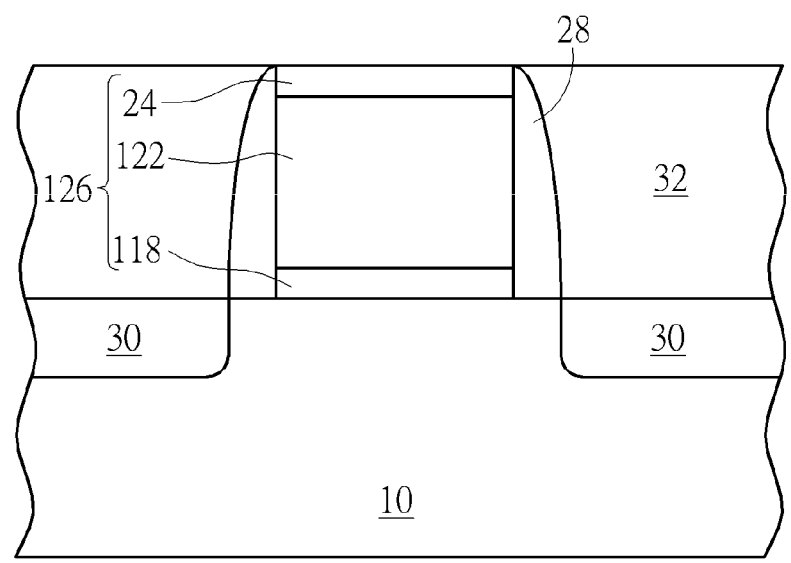
FIG. 8 to FIG. 10 schematically show a method of fabricating a high-K metal gate transistor with a multilayer gate oxide by a high-K dielectric last process according to a third embodiment of the present invention.
Figure 9:
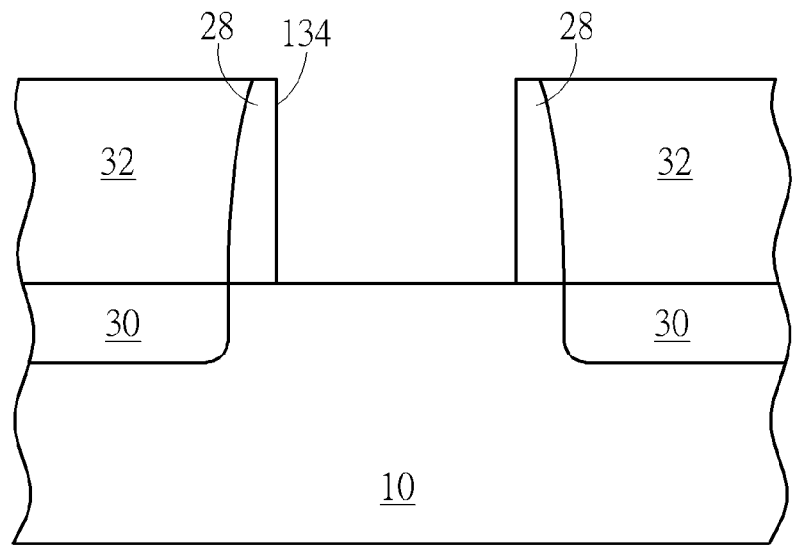
Figure 10:
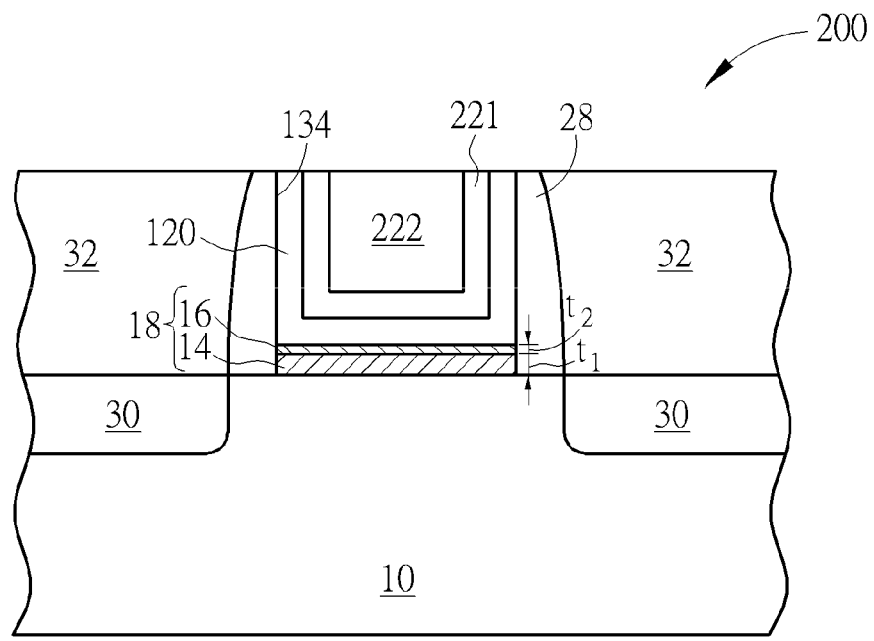

FIG. 8 to FIG. 10 schematically show a method of fabricating a high-K metal gate transistor with a multilayer gate oxide by a high-K dielectric last process according to a third embodiment of the present invention, wherein like reference numerals are used to refer to like elements throughout. As shown in FIG. 8, a substrate 10 is provided. Later, a dummy gate oxide layer 118, a dummy gate 122, a cap layer 24 are formed in sequence to form a gate structure 126 on the substrate 10. The dummy gate 122 may include polysilicon. After that, a spacer 28 is formed to surround the gate structure 126. After that, a source/drain doped region 30 is formed at two sides of the gate structure 126. Later, a dielectric layer 32 is formed to cover the gate structure 126, the spacer 28 and the substrate 10.

As shown in FIG. 9, the dielectric layer 32 is planarized and the cap layer 24 is removed to expose the dummy gate 122. Then, the dummy gate 122 and the dummy gate oxide layer 118 are removed to form a recess 134. The substrate 10 is exposed through the recess 134. As shown in FIG. 10, a multilayer gate oxide 18 is formed in the recess 134 and on the substrate 10 according to the method illustrated in FIG. 2 to FIG. 4. For details of the fabricating methods and properties of the first gate oxide 14 and the second gate oxide 16, please refer to the first preferred embodiment of the present invention.

As shown in FIG. 10, the first gate oxide 14 and the second gate oxide 16 form a rectangular profile. After that, a high-K dielectric 120 is formed to conformally cover two sidewalls of the recess 134, and the high-K dielectric 120 contacts the second gate oxide 16. Therefore, the high-K dielectric 120 forms a U-shaped profile. Later, a work function layer 221 is formed in the recess 134. Then, a metal filling layer 222 is formed in the recess 134. At this point, a high-K metal gate transistor 200 with a multilayer gate oxide 18 fabricated by a high-K dielectric last process is completed. As shown in FIG. 10, the semiconductor structure with a multilayer gate oxide, such as the high-K metal gate transistor 200 is provided. The primary difference between the high-K metal gate transistor 100 and the high-K metal gate transistor 200 is that the high-K dielectric 120 of the high-K metal gate transistor 200 is U-shaped and the high-K dielectric 20 of the high-K transistor 100 is rectangular.

One advantage of the semiconductor structure with a multilayer gate oxide disclosed and described herein is that, because the second gate oxide is formed by chemical treatment, the second gate oxide is hydrophilic. Therefore, the high-K material can contact to the second gate oxide tightly. Furthermore, the first gate oxide is formed by a thermal oxidation process. Therefore, the first gate oxide has good quality without pin holes thereon.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor structure with a multilayer gate oxide, comprising:
   a substrate;

a multilayer gate oxide disposed on the substrate, wherein the multilayer gate oxide comprises:
    a first gate oxide contacting the substrate; and
    a second gate oxide disposed on and contacting the first gate oxide, wherein the second gate oxide is hydrophilic and the second gate oxide is silicon oxide.

2. The semiconductor structure with a multilayer gate oxide of claim 1, wherein a first thickness of the first gate oxide is greater than a second thickness of the second gate oxide.

3. The semiconductor structure with a multilayer gate oxide of claim 2, wherein the ratio of the first thickness to the second thickness is not smaller than 3/2.

4. The semiconductor structure with a multilayer gate oxide of claim 1, wherein the first gate oxide has a chemical formula of $Si_AO_B$, the second gate oxide has a chemical formula of $Si_XO_Y$, and the ratio of B to A is greater than the ratio of Y to X.

5. The semiconductor structure with a multilayer gate oxide of claim 1, further comprising a high-K material disposed on and contacting the second oxide layer.

6. The semiconductor structure with a multilayer gate oxide of claim 5, further comprising a metal filling layer disposed on the high-K material.

7. A semiconductor structure with a multilayer gate oxide, comprising:
    a substrate;
    a multilayer gate oxide disposed on the substrate, wherein the multilayer gate oxide comprises:
        a first gate oxide contacting the substrate;
        a second gate oxide disposed on and contacting the first gate oxide, wherein the second gate oxide is hydrophilic; and
        a high-K material disposed on and contacting the second oxide layer.

* * * * *